United States Patent
Lin et al.

(10) Patent No.: US 7,083,495 B2
(45) Date of Patent: Aug. 1, 2006

(54) ADVANCED PROCESS CONTROL APPROACH FOR CU INTERCONNECT WIRING SHEET RESISTANCE CONTROL

(75) Inventors: Chun Hsien Lin, Hsin Chu (TW); Ai-Sen Liu, Hsinchu (TW); Sunny Wu, Douliou (TW); Yu-Liang Lin, Hsin-chu (TW); Henry Lo, Hsinchu (TW); Mei-Sheng Zhou, Singapore (SG)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 127 days.

(21) Appl. No.: 10/723,236

(22) Filed: Nov. 26, 2003

(65) Prior Publication Data

US 2005/0112997 A1 May 26, 2005

(51) Int. Cl.
*B24B 49/00* (2006.01)
*B24B 1/00* (2006.01)
(52) U.S. Cl. .............................. 451/5; 451/28; 451/41; 451/8
(58) Field of Classification Search .................... 451/5, 451/6–10, 41, 28, 285–288
See application file for complete search history.

(56) References Cited

U.S. PATENT DOCUMENTS

| 5,655,951 A * | 8/1997 | Meikle et al. ............... 451/56 |
|---|---|---|
| 5,719,495 A | 2/1998 | Moslehi ................. 324/158.1 |
| 6,148,239 A | 11/2000 | Funk et al. ..................... 700/1 |
| 6,335,286 B1 | 1/2002 | Lansford ................... 438/692 |
| 6,372,632 B1 | 4/2002 | Yu et al. ..................... 438/634 |
| 6,405,144 B1 | 6/2002 | Toprac et al. ................. 702/84 |
| 6,514,858 B1 | 2/2003 | Hause et al. ................ 438/640 |
| 6,528,818 B1 | 3/2003 | Satya et al. ................... 257/48 |
| 6,555,477 B1 | 4/2003 | Lu et al. ..................... 438/692 |
| 6,594,542 B1 * | 7/2003 | Williams .................... 700/164 |
| 6,884,147 B1 * | 4/2005 | Toprac .......................... 451/5 |
| 2005/0112997 A1 * | 5/2005 | Lin et al. ........................ 451/5 |

OTHER PUBLICATIONS

J. Zhang et al., "Automated Process Control of Within-Wafer and Wafer-to-Wafer Uniformity in Oxide CMP," [online] Mar. 2002, CMP MIC [retrieved on Jan. 27, 2003] retreived from URL: http:www.appliedmaterials.com/search97cgi/597_sgi.

* cited by examiner

*Primary Examiner*—Lee D. Wilson
(74) *Attorney, Agent, or Firm*—Haynes and Boone, LLP

(57) ABSTRACT

A wafer based APC method for controlling an oxide (Cu, or TaN) polish step is described and combines a feed forward model that compensates for incoming wafer variations with a feed backward model which compensates for CMP variations. The method is geared toward minimizing Rs 3σ variations. A Rs target value is inputted with metrology data from previous processes that affects the width and thickness of the copper layer. A copper thickness target and polish time for the first wafer is determined. Post CMP measurement data of the first wafer is used to modify the polish rate with a disturbance factor and an updated polish time is computed for subsequent wafers. The CMP recipe for each wafer is adjusted with metrology data and post CMP measurements. The APC method is successful in controlling copper Rs variations for the 90 nm technology node and is independent of copper pattern density.

29 Claims, 3 Drawing Sheets

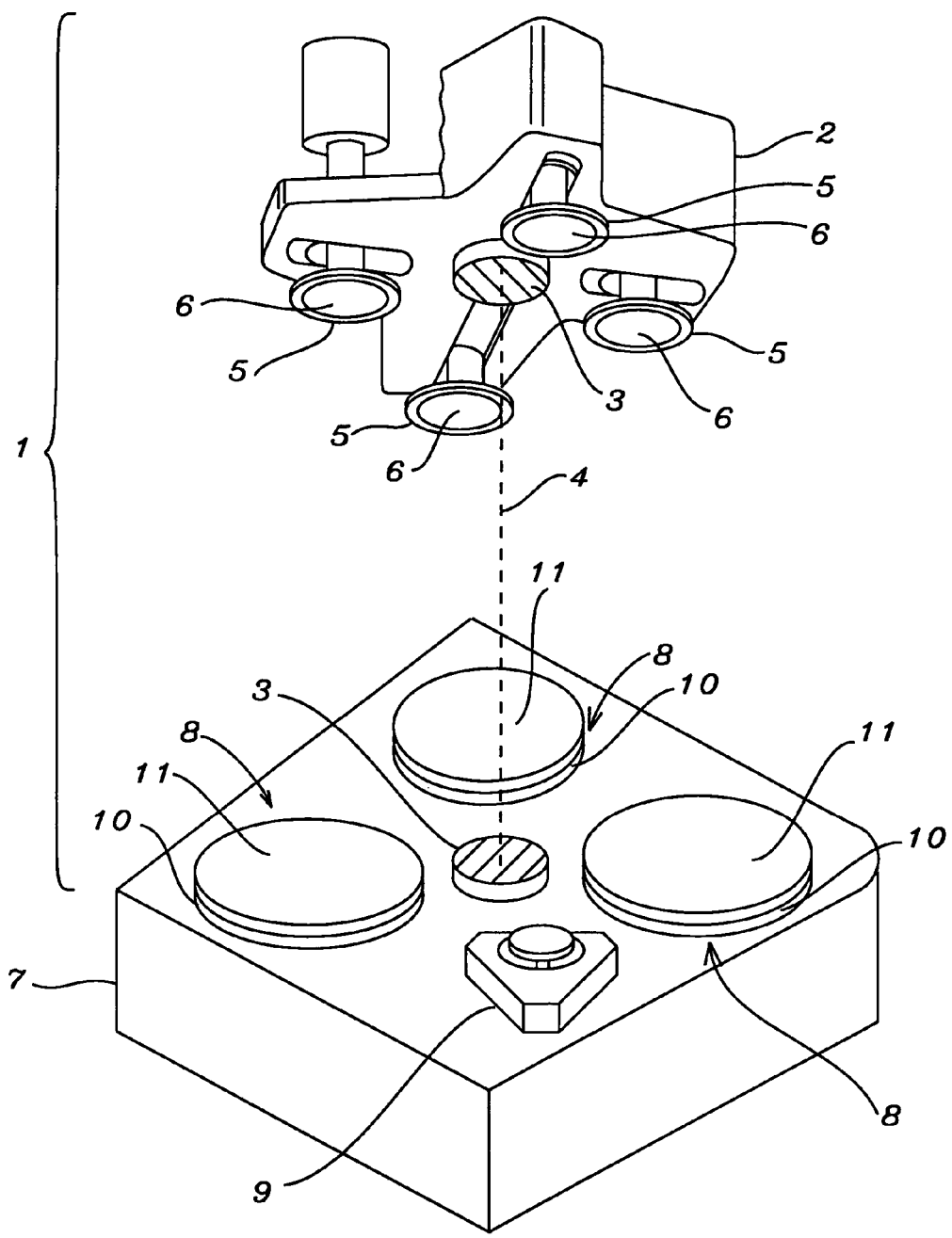
FIG. 1 – Prior Art

ADVANCED PROCESS CONTROL APPROACH FOR CU INTERCONNECT WIRING SHEET RESISTANCE CONTROL

FIELD OF THE INVENTION

The invention relates to the field of fabricating integrated circuits and in particular to a method of performing a chemical mechanical polishing step on copper wiring with a higher degree of process control to enable copper sheet resistance to be minimized.

BACKGROUND OF THE INVENTION

The use of copper wiring as interconnects in semiconductor devices has increased dramatically as ground rules shrink in order to prevent capacitance coupling or crosstalk between metal lines. Interconnects are typically formed by a damascene approach in which a metal layer is deposited in an opening etched into one or more dielectric layers on a substrate. An important aspect of the damascene process is planarization of the metal layer which becomes coplanar with the top dielectric layer. A chemical mechanical polish (CMP) step is frequently employed as the preferred method to achieve planarization.

A commercially available CMP tool represented by tool 1 in FIG. 1 is used to perform the planarization process. Tool 1 includes an upper carousel 2 that can rotate about a center post 3 on a center axis 4. Carousel 2 contains four rotatable carrier heads 5 that each holds a wafer 6. The base 7 of the CMP tool 1 is comprised of three polishing stations 8 and a transfer station 9. Each polishing station 8 has a rotatable platen 10 upon which a polishing pad 11 is placed and a mechanism for introducing a chemical slurry (not shown) that aids the polishing process. Typically, a wafer 6 is pressed against a polishing pad and slurry while the head 5 is rotated in one direction and the platen 10 is rotated in the opposite direction. Other parts of the CMP tool 1 are not shown and may include an end point detect system to prevent excessive polishing of a metal or dielectric layer.

The CMP process has been improved by implementing methods to avoid defects such as scratches and dishing on the surface of the metal layer or dielectric layer. As the width and height of metal interconnects becomes smaller in advanced technologies, more emphasis must be placed on a method to minimize variations in copper sheet resistance (Rs) that has a direct bearing on device performance. Currently, there is no manufacturing approach to control copper Rs variations.

A planarization method may involve two or more CMP steps that each require a different slurry which is selective to a particular layer. For instance, in U.S. Pat. No. 6,555,477, separate steps are employed to polish a copper layer, a barrier layer, and an intermetal dielectric (IMD) layer in one sequence. A copper polishing step followed by an oxide buffing step is described in U.S. Pat. No. 6,372,632.

J. Zhang, J. Paik, B. Lusher, B. Brown, S. Huey, M. Sarfaty, A. Shanmugasundram, A. Schwarm, A. Sikora and A. Nickles in "Automated Process Control of Within-Wafer and Wafer-to-Wafer Uniformity in Oxide CMP" [online] March 2002, CMP MIC [retrieved on Jan. 27, 2003] retrieved from URL: http:www.appliedmaterials.com/search97cgi/s97_sgi describes a within wafer closed loop control with feed-forward and feed-backward of data to provide run-to-run control. Here the goal is to control Rs in bulk copper that is later removed by CMP. The Rs of an actual interconnect is not measured and there is no provision to reduce copper sheet resistance variations in the product.

A prior art method for optimizing wafer by wafer processing is found in U.S. Pat. No. 6,405,144 involving input signals that are controlled by feed-forward and feed-backward pathways. Individual recipes are updated by a remote parameter setting command from a central computer. In related art, feed forward threads are based on material groups and a set of rules is applied in a logic program for process control as claimed in U.S. Pat. No. 6,148,239.

In U.S. Pat. No. 6,335,286, a CMP buffing process is controlled by monitoring the scratch count on a process surface and feeding the data back to a process controller. An in-situ non-invasive method of determining physical properties such as sheet resistance and film thickness is provided in U.S. Pat. No. 5,719,495. Still, there is no known algorithm that can be applied to a CMP process to control copper sheet resistance.

Process control is also achieved through test structures as in U.S. Pat. No. 6,528,818 where a system for detecting defects is described and in U.S. Pat. No. 6,514,858 which involves a test structure to monitor CMP polish depth.

Monitor wafers are typically non-product wafers that are inserted into a production scheme in order to verify that process parameters are being maintained within specification. This practice can minimize rework by detecting an unacceptable drift in a process tool operation before a large amount of product wafers are processed incorrectly. However, monitor wafers may be over utilized to the extent that the fabrication method becomes unprofitable because of the loss of production time or down time associated with monitors. Product wafers may be held in queue until a monitor wafer is processed and measured for defects and parameters such as film thickness and uniformity. Therefore, a good automated process control (APC) method should minimize the amount of monitor wafers necessary in a production environment.

SUMMARY OF THE INVENTION

An objective of the present invention is to provide an APC method for a CMP process that minimizes Cu sheet resistance (Rs) variations in copper interconnects.

A further objective of the present invention is to provide an APC method for an oxide, Cu, or TaN polish process in a CMP tool that is based on feed forward and feed backward models. Process adjustments for a polish step depend on the process consumable selection and tool types.

A still further objective of the present invention is to provide a wafer based Cu CMP APC method that is extendable to 130 nm and sub-100 nm technology generations.

Yet another objective of the present invention is to provide a wafer based Cu CMP APC method that reduces Cu Rs variations for a variety of wiring pattern densities.

Another objective of the present invention is to provide an advanced process control system for controlling a CMP process.

These objectives are achieved in a wafer based APC method that is applied to an adjustable polish step of a copper layer which in one embodiment is formed on a TaN barrier layer in an opening within a dielectric layer on a substrate. The wafer based APC method may be used to control one or more steps of a three step polish sequence. The copper layer is polished to become coplanar with the TaN barrier layer in a first polish step. The TaN barrier layer is removed from above the dielectric layer in the second polish step and the dielectric layer is buffed in a third oxide polish step that also smoothes the Cu and TaN layers which are coplanar with the dielectric layer. The wafer based APC method of the present invention is employed to minimize Rs variations by controlling the time for the oxide (Cu, or TaN) polish step on each substrate which is typically a wafer. The Cu, TaN, and oxide polish step time may be adjusted to control Rs and depends on CMP tool types and on consumables such as the slurry composition and polish pad wear. Optionally, the wafer based APC method may be used only for the oxide polish step by adjusting polish time and controlling Cu thickness to afford a Rs value within a manufacturing specification.

The wafer based APC method is comprised of a feed forward (FF) model which compensates for incoming wafer variations and a feed backward (FB) model that compensates for CMP tool variations. The FF and FB models are maintained in a computer that is linked to a graphics user interface (GUI) and to an APC controller which manages one or more CMP tools and processes. A Rs target value and metrology data relating to trench width and copper thickness are inputted to the FF model and a $Rs_{TOTAL}$ for the copper line after the initial Cu CMP step is computed with an algorithm. A copper thickness target and polish time for the Cu, TaN, or oxide polish step are determined from the Rs target value, the $Rs_{TOTAL}$, and the CMP Cu, TaN, or oxide polish rate ($\alpha$) and are sent to the APC controller.

The APC controller is linked to a tool control system (TCS) in a CMP tool and inputs a modified CMP recipe with a specific oxide (Cu, or TaN) polish time for each wafer to the TCS based on new FF model data. A FB model is exercised by feeding post-CMP oxide (Cu, or TaN) thickness measurements to the computer. A disturbance value is calculated from the new CMP data in the FB model and is forwarded to the APC controller to adjust the oxide (Cu, or TaN) polish rate for subsequent wafers sent to the CMP tool for processing. Thus, the copper thickness target data and oxide (Cu, or TaN) polish time target provided for each wafer by the FF model is continuously updated with current CMP polish results to compensate for CMP tool variations. Since the APC method has both a FF and FB mechanism, fewer monitor wafers are needed to control the CMP process compared to an APC method that depends only on CMP polish rate measurements.

In another embodiment, one APC controller may serve more than one CMP process tool. The APC controller is capable of accepting data from more than one computer which contains the FF and FB models of the present invention. Optionally, the FB model may receive post CMP measurement data from more than one CMP tool.

The invention is also a process control system for one or more CMP processes comprised of a computer with a program that includes a feed forward model and a feed backward model, an APC controller, and a tool control system (TCS) with a tool application program (TAP) for a CMP tool. The computer operates in a feed forward function by taking metrology data from previous process steps and determining a Cu, TaN, or oxide polish thickness and polish time for each wafer based on a Rs target value that is inputted through a user interface. This information is transferred to the APC controller which adjusts the CMP recipe for the wafer accordingly and sends the updated recipe to the TCS for the CMP tool. Post CMP data such as Cu, TaN, or oxide thickness from the CMP tool or from an independent metrology tool is fed back to the FB model which is used to calculate an adjustment in Cu, TaN, or oxide polish time for a subsequent wafer to be processed. Therefore, a real time adjustment in polish time and CMP recipe for each substrate in a series of substrates to be processed may be performed by a continual cycle of feed forward and feed backward communications.

BRIEF DESCRIPTION OF THE DRAWINGS

The features and advantages of a semiconductor process method according to the present invention will be more clearly understood from the following description taken in conjunction with the accompanying drawings in which like reference numerals designate similar or corresponding elements, regions, and portions, and in which:

FIG. 1 illustrates a conventional CMP tool that has four carrier heads, three polishing stations and a wafer transfer station.

DETAILED DESCRIPTION OF THE INVENTION

Figure 2A:
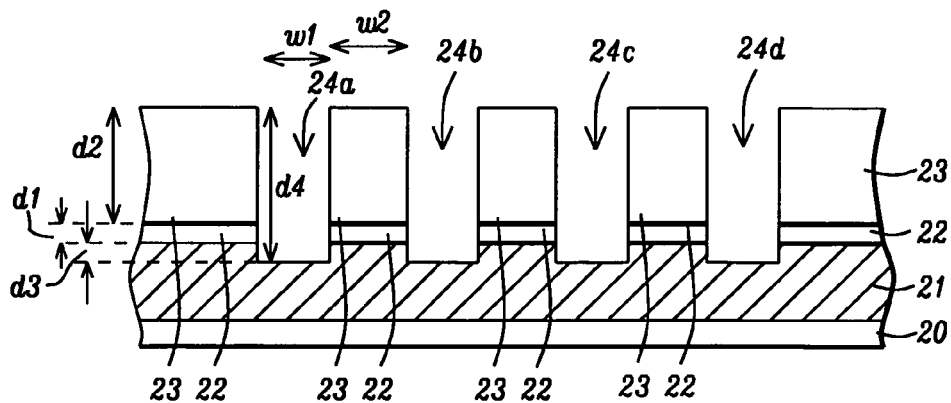
FIGS. 2a–2c are cross-sectional views showing an exemplary copper interconnect at various stages of manufacture including trench formation, copper deposition, and planarization following a CMP oxide (Cu, or TaN) polish step.

The present invention is an advanced process control (APC) method that is particularly useful for minimizing copper sheet resistance (Rs) in copper interconnects formed in a semiconductor device. Although a single damascene structure involving a trench formed in a dielectric layer on a substrate is shown in the drawings, other types of copper interconnects such as those comprising a trench and a via in a dual damascene scheme or stacked layers of metal wiring that are fabricated by performing a plurality of damascene processes are also within the scope of this invention. Furthermore, the APC method for controlling an oxide (Cu, TaN) polish step is not necessarily limited to only copper interconnects but may be applied to the fabrication of interconnects comprised of other metals such as Al/Cu alloys, Al, and W which are formed in a dielectric layer. Moreover, other diffusion barrier layers such as TiN, Ta/TaN, or Ti/TiN may be used in place the TaN layer in the exemplary embodiment.

Figure 2B:
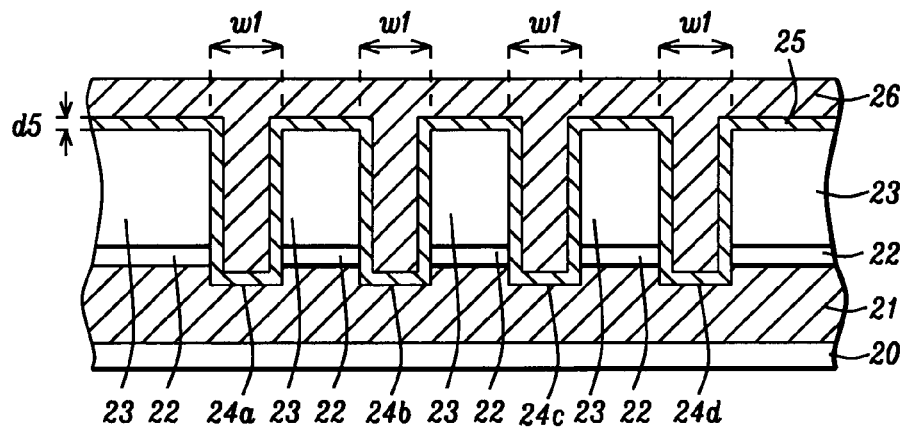
Figure 2C:
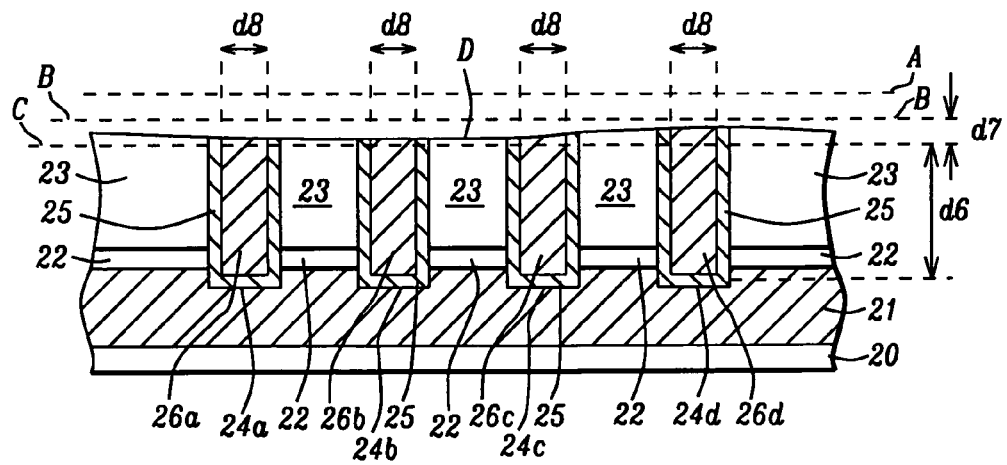

An exemplary method for forming a copper interconnect is illustrated in FIGS. 2a–2c. Referring to FIG. 2a, a substrate 20 is provided that is typically silicon. A planar metal layer 21 that is preferably comprised of copper but may be W, Al, or an Al/Cu alloy is formed on substrate 20 and planarized by a conventional process. An etch stop layer 22 comprised of silicon nitride, silicon carbide, or silicon oxynitride is deposited by a CVD or plasma enhanced CVD method and has a thickness d1 of about 100 to 800 Angstroms that varies slightly across the wafer and from wafer to wafer because of nonuniformity in the deposition process. A dielectric layer 23 that is $SiO_2$ or preferably is a low k material such as fluorine doped $SiO_2$, carbon doped $SiO_2$, a poly(arylether), benzocyclobutene, a poly(silsesquioxane), or a polyimide is deposited by a CVD or spin-on method. When the dielectric layer 23 is comprised of a low k material, the dielectric layer 23 is typically cured by heating at temperatures up to 600° C. and may be further processed with a plasma treatment to densify the layer. The dielectric layer 23 has a thickness d2 of between 2000 and 10000 Angstroms which varies across substrate 20 due to the nature of the CVD or spin-on process.

Trenches 24a–24d are formed by a conventional method that typically includes patterning a photoresist layer (not shown) on the dielectric layer 23 and using the patterned layer as an etch mask while transferring the pattern through the dielectric layer 23 and etch stop layer 22 with a plasma etch process. Any remaining photoresist layer is removed following the etch process. It is understood that other trenches (not shown) are typically formed in the dielectric layer 23 during the same patterning and etch sequence. The other trenches may be arranged in patterns that range from isolated trenches to densely formed trenches. The trenches 24a–24d have a critical dimension (CD) shown as w1 which may vary depending on the location of the trench 24a–24d on the substrate 20 and location within a pattern. For instance, the outer trenches 24a, 24d may have a different size w1 than the inner trenches 24b, 24c because of imperfections in the photoresist patterning step and in the etch process. Furthermore, the size of w1 in trench 24a on substrate 20 may be different than the size of w1 in trench 24a on a second substrate that is not shown. Etch variations may also result in the extension of one or more of trenches 24a–24d into the metal layer 21 by a distance d3 which is from 0 to 500 Angstroms. Thus, the total depth d4 of the trenches 24a–24d is equivalent to d1+d2+d3 and may vary from about 0 to 600 Angstroms. The width w2 between adjacent trenches 24a, 24b, for example, may vary from less than one micron to more than 10 microns.

Referring to FIG. 2b, a conformal diffusion barrier layer 25 is deposited in the trenches 24a–24d by a CVD or plasma enhanced CVD (PECVD) method and has a thickness d5. However, the thickness d5 may vary from wafer to wafer because of nonuniformity in the CVD process. The diffusion barrier layer 25 is preferably TaN but may be comprised of one or more of Ta, Ti, TiN, TiSiN, W, WN, $Si_3N_4$ or combinations thereof and has a thickness d5 between about 10 and 300 Angstroms. Note that the width of the trenches 24a–24d that is available for a copper fill layer 26 is reduced from w1 to w1–2d5 because of the diffusion barrier 25. Likewise, the depth of the trenches 24a–24d that is available for a copper layer 26 is reduced from d4 to (d4–d5) because of the diffusion barrier layer 25.

The copper layer 26 is preferably deposited by an electroless plating or electroplating process known to those skilled in the art but may also be formed by a physical vapor deposition (PVD) or atomic layer deposition (ALD) process. The copper layer 26 does not necessarily have a planar surface after deposition as shown in the drawing. Typically, the surface of the copper layer 26 is lower over the trenches 24a–24d than over the dielectric layer 23 adjacent to the trenches. Moreover, there is variation in the copper layer 26 thickness from wafer to wafer and at different locations on the same wafer.

Referring to FIG. 2c, a first polish step that is preferably performed on a first platen in a CMP tool removes the copper layer 26 from above the diffusion barrier layer 25. In the embodiment where the diffusion barrier layer 25 is TaN, some of the TaN may be removed during the first polish step. A second polish step is then typically performed at a second platen in the CMP tool and removes the TaN layer 25 from above the dielectric layer 23. The total thickness of copper layer 26 and TaN layer 25 removed during the first two polish steps is indicated by the distance between dashed lines A and B. The removal rate of the dielectric layer 23 during the first and second polish steps is minimal so that a substantially planar surface as represented by the dashed line B is formed. Note that the dashed line B is approximately at the same level as the top of the dielectric layer 23 in FIG. 2b. As a result, copper lines 26a–26d are formed and have a thickness (d4–d5) and a width d8 that is equivalent to the dimension (w1–2d5).

The Rs of the copper lines 26a–26d is a function of (d1–d5), d8, w1, and w2 as indicated by the equation (1) below. It is understood that a plurality of wafers are typically processed through a process tool in lots of from 1 to 25 wafers. The relationship of Rs on the values (d1–d5), d8, w1, and w2 in equation (1) is determined by line fitting the data from a plurality of wafers which have been processed through a first and second polish step. Note, however, that the values in equation (1) are known prior to the first oxide polish step and may be used by the APC method of this invention to control the first and second polish steps.

Figure 4:
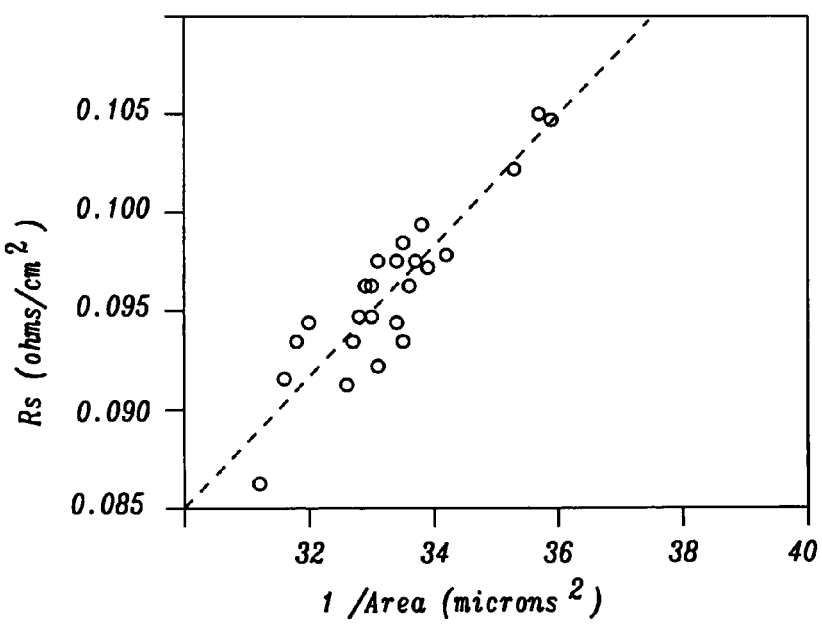
FIG. 4 is a graph that depicts how sheet resistance (Rs) is related to the cross-sectional area of a Cu wire in a trench according to a method of the present invention.

A representative plot of the data is depicted in FIG. 4 where (1/copper cross-sectional area in microns$^2$) is shown on the x axis and Rs in ohms/μm$^2$ is on the y axis. In this example, the relationship expressed by equation (1) is the following:

$$Rs = f(d1-d5, d8, w1, w2) \qquad (1)$$

All dimensions d1–d5, d8, w1, and w2 are determined by thin film metrology, metal metrology, CD-SEM, or with an optical CD (OCD) measurement. These techniques are known to those skilled in the art and are not described herein. Several data points may be taken per wafer and an average value for each of the aforementioned dimensions is stored in a computer that also contains a feed forward (FF) model for calculating a copper thickness target for the copper lines 26a–26d.

A third polish step called an oxide polish is preferably performed on a third platen in the same CMP tool used for the first and second polish steps. In addition to removing the top portion of the dielectric layer 23, the oxide polish step is intended to polish the copper lines 26a–26d to a targeted thickness d6 which is represented by the dashed line C in order to achieve a Rs value that is within specification. Note that the distance between the dashed line B and the dashed line C is a thickness d7 and that (d6+d7) is equivalent to (d4–d5). Preferably, the TaN layer 25 remains coplanar with the Cu layer 26 and the dielectric layer 23 in the third polish step.

Because of nonuniformity in the oxide (Cu, or TaN) polish step, copper lines, TaN layer 25, and the dielectric layer 23 may be removed faster in some portions of the wafer than in others. For example, a CMP process frequently removes copper at a faster rate in densely formed lines than in isolated or semi-isolated lines. As a result, the polished surface following the oxide polish step may be represented by the non-planar solid line D. Likewise, the dashed line B may be uneven after the first or second polish step. Usually, dense lines such as the copper lines 26b, 26c with two neighboring lines and adjacent portions of the dielectric layer 23 are thinned more rapidly than semi-isolated lines such as the outer copper lines 26a, 26d and the dielectric layer 23 outside the line pattern. Therefore, a targeted copper thickness d6 may be achieved only in some copper lines 26b, 26c while other copper lines 26a, 26d have a thickness between d6 and (d6+d7). The magnitude of this copper thickness variation has a direct bearing on the 3σ variation in Rs for the copper lines 26a–26d. An objective for a 3σ variation of less than 10% in the Rs mean value is recognized by the inventors as a target for improving performance in current generation copper interconnects.

Figure 3:
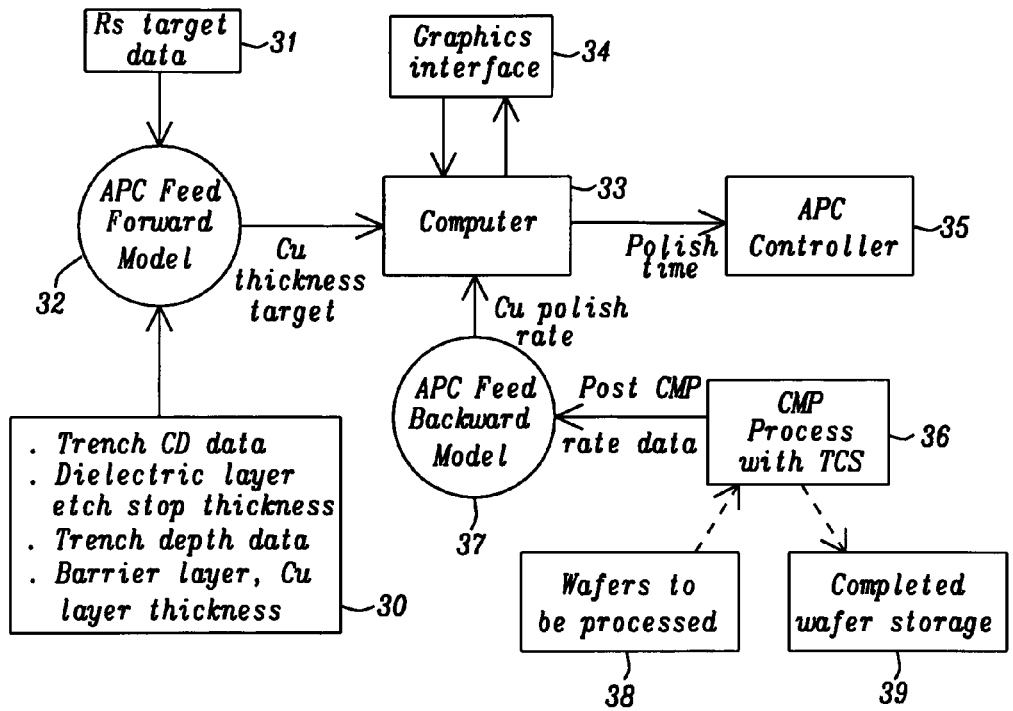
FIG. 3 is a flow diagram that depicts how the feed forward and feed backward models are implemented into a wafer based APC method for controlling a CMP oxide (Cu, or TaN) polish process according to the present invention.

A key feature of the present invention is a wafer based APC method to control one or more of the previously described polish steps. A wafer based APC method for the oxide (Cu, TaN) polish process has been discovered that compensates for thickness variations in copper lines within a wafer (WIW) and from wafer to wafer (WTW) and thereby minimizes copper Rs variations in copper interconnects fabricated from these copper lines. Referring to FIG. 3, the data 30 that was obtained by metrology measurements after previous process steps is fed into a FF model 32 which is contained in a computer 33 that is linked to a graphics interface 34 and an APC controller 35. Metrology data 30 generally includes trench CD data w1, the dielectric layer thickness d2, the etch stop thickness d1, trench depth data including d3, as well as diffusion barrier thickness d5 and copper thickness data (d4–d5). A Rs target ($Rs_T$) value 31 for a particular substrate (wafer) is also fed into the FF model 32.

The FF model 32 is used to calculate a target thickness d6 shown in FIG. 2c for copper lines 26a–26d for the oxide (Cu, or TaN) polish step by taking into account the Rs target ($Rs_T$) value 31 and substituting d6 for the value [d4–d5] (not shown) in equation (1). In other words, the copper target thickness d6 is also related to d1, d2, d3, d4, d5, d8, w1, and w2 which represent upstream process variations. However, there is some uncertainty associated with the target thickness value d6 because of variations in the width d8. Additional refinement of the model may also be done to account for variations in d1, d2, d3, d4, d5, w1, and w2.

In a preferred embodiment, a second step is performed to further refine the FF model 32 and account for copper cross-sectional area variations associated with previous process steps. The $Rs_{TOTAL}$ for the copper lines 26a–26d or alternatively for the copper layer 26 is calculated using an algorithm represented by equation (2) that reflects the contributions from variations in the process sequence used to form the copper lines on Rs. The process sequence includes a patterning (photo) process, CVD process, copper deposition (ECP) process, and etch process. Optionally, each of the photo, CVD, ECP, and etch processes may involve more than one step. In this case, the Rs contributions from each step in a process are added to arrive an Rs for the particular process. It is understood that two steps in a photo process may be separated by one or more etch steps, for example. The $Rs_{TOTAL}$ is therefore an adjustment that must be made to the $Rs_T$ value due to variations in previous processes that have produced a copper line or copper layer with a cross-sectional area that is different from the intended value. The contributions from each of the previously described processes are added in the following equation:

$$Rs_{TOTAL}=Rs_{PHOTO}+Rs_{CVD}+Rs_{ECP}+Rs_{ETCHING} \quad (2)$$

The variation in copper line width d8 is related to non-uniformity in the width w1 of the trenches 24a–24d which is represented by $Rs_{PHOTO}$. For example, if w1 is larger than a targeted value, then Rs in equation (1) will be affected since the resulting copper line will have a different cross-sectional area than originally intended. The difference between the intended Rs value and the modified Rs value caused by the larger w1 is $Rs_{PHOTO}$. Variations in the copper thickness (d6+d7) are related to non-uniformity in the thickness d1 of the etch stop layer 22, thickness d2 of the dielectric layer 23, and in the thickness d5 of diffusion barrier layer 25 and the effect on Rs is represented by the term $Rs_{CVD}$. Variation in the copper thickness (d6+d7) is also related to imperfections in the copper electroplating step, for example, and is represented by the term $Rs_{ECP}$. The copper thickness (d6+d7) is also a function of the depth d3 to which trenches 24a–24d are etched beyond the etch stop layer 22 and this contribution to $Rs_{TOTAL}$ is represented in the term $Rs_{ETCHING}$. In other words, the variation from a target value is determined for each process to find the impact of a process variation on $Rs_{TOTAL}$.

The copper thickness target d6 originally determined by substituting $Rs_T$ for Rs and d6 for the quantity (d4–d5) in equation (1) is recalculated in the preferred embodiment by adjusting the $Rs_T$ value with the $Rs_{TOTAL}$ value obtained in equation (2). The adjusted $Rs_T$ value is substituted for Rs and d6 is substituted for [d4–d5] (not shown) in equation (1) to arrive at an adjusted copper thickness target d6. This process is repeated for each wafer to be polished. It is possible that a unique d6 value will be necessary for each of the plurality of wafers to be processed in order to achieve a desired Rs value for a copper interconnect on each wafer.

A target oxide (Cu, or TaN) polish time ($PT_t$) for a wafer is then determined in the computer 33 based on the $Rs_{TOTAL}$ shown in equation (2), the known CMP oxide (Cu, or TaN) polish rate $\alpha$, and the Rs target value $Rs_T$ for a particular wafer according to equation (3):

$$PT_t=Rs_T-Rs_{TOTAL}/\alpha \quad (3)$$

The $PT_t$ result is forwarded to the APC controller 35 which makes an adjustment in the oxide (Cu, or TaN) polish recipe for the wafer to be processed 38 and sends this information to the TCS in the CMP process tool 36. In a preferred embodiment, the process of determining a copper thickness target and an oxide (Cu, or TaN) polish time is performed for each wafer in a plurality of wafers to be polished. The CMP tool 36 has the capability to do in-situ polish rate measurements and sends post CMP polish rate data to the APC FB model 37 in the computer 33. In an alternate embodiment, the copper thickness d6 of one or more polished copper layers 26a–26d is measured by a metrology tool outside the CMP process tool and the resulting copper thickness data is sent to the FB model 37 in the computer 33. Meanwhile, wafers that have completed the oxide (Cu, or TaN) polish step are sent to wafer storage 39.

The APC FB model 37 is preferably contained in the same program as the FF model 32 in computer 33 and complements the FF model 32 by recognizing variations or disturbances in the oxide (Cu, or TaN) polish rate data. For example, the chemical composition of a slurry used in the CMP tool 36 may gradually change with time and a different polish rate occurs as successive wafers are processed. Other factors in the CMP process such as wear of the polish pads and pad pressure fluctuations are capable of changing the polish rate a as a series of wafers is being processed. To compensate for these polish rate changes, an adjustment is made in the polish time for a subsequent wafer by modifying equation (3) to include a disturbance value $d_K$ as shown in equation (4).

$$PT_t=Rs_T-Rs_{TOTAL}/(\alpha+d_K) \quad (4)$$

For the first wafer in a plurality of wafers to be processed, $d_K$ may be set to 0 or the disturbance value $d_K$ from a previous lot of wafers may be inserted in equation (4). For the nth wafer in a plurality of wafers to be polished, the polish time $PT_n$ and disturbance value $d_K$ may be calculated according to equation (5):

$$PT_n=Rs_T-Rs_{n,TOTAL}/(\alpha+d_K) \quad (5)$$

where $d_K=(1-\lambda)d_{K-1}+\lambda(Rs_T-Rs_{n,TOTAL}-\alpha PT_{K-1})$ in which $Rs_{n,TOTAL}$ is the $Rs_{TOTAL}$ for the nth wafer, $d_{K-1}$ and $PT_{K-1}$ are the disturbance factor and oxide (Cu, or TaN) polish time, respectively, for the previous (n−1)th wafer, and where λ is a value between 0 and 1. Typically, a post CMP thickness measurement is taken after every 1 to 25 wafers are processed to monitor the polish rate. A post CMP measurement could be performed on each product wafer but this practice would slow throughput and is not preferred. On the other hand, waiting too long between post CMP measurements could result in an oxide (Cu, or TaN) polish rate change going undetected that eventually leads to a copper Rs which is outside a specified range. The computer 33 then sends a new oxide (Cu, or TaN) polish time ($PT_n$) to the APC controller 35 for the nth wafer in a sequence to be processed in the CMP tool 36. The APC controller contacts the TCS in CMP tool 36 so that a proper adjustment in the recipe for the nth wafer is made. Similarly, the polish time for the (n+1)th wafer may be modified based on the polish rate and disturbance value for the nth wafer and so forth. However, other filter algorithms such as those based on a moving average or on a Kalman filter may be used to adjust the $d_{K-1}$ (and $d_K$) according to the post CMP process measurement result.

Thus, adjustments to variations in incoming wafer variations and in CMP process changes may be accomplished on a real time basis by implementing the APC method comprised of the FF and FB models of the present invention. In another embodiment, the APC controller 35 may function as a server and receive input for up to about 20 CMP tools from one or more computers that manage the FF and FB models. In other words, the APC controller 35 may have multiple input and output channels. In still another embodiment, the APC controller 35 may control other processes in addition to the oxide (Cu, or TaN) polish step.

An advantage of the APC method of the present invention which is also referred to as a cross loop process (CLP) is that Rs variation for a variety of copper line pattern densities is reduced relative to a prior art open loop process (OLP) that is based only on a feed back model. These results are summarized in Tables 1–5 below. A 44% improvement in 3σ variation is observed for a pattern density of 50% in which copper lines of width d8 are formed in trenches that are separated by a dielectric layer having a width w2 where d8=w2. A TaN diffusion barrier layer was formed in the trenches prior to copper deposition. This benefit is realized for the most advanced technology which is currently the 90 nm node and for older technologies with ground rules above 100 nm.

TABLE 1

Rs mean and 3σ values
in m-ohms for a test structure where d8 = w2 = 0.12 μm

| Method | Cu Rs WIW 3σ | Cu Rs WTW 3σ | Sum (3σ) | Rs 3σ improvement | Rs mean |
|---|---|---|---|---|---|
| OLP | 8.4 | 11.4 | 13.9 | — | 93.0 |
| CLP | 6.9 | 3.7 | 7.7 | 44% | 93.2 |

A 32% improvement in 3σ variation for copper Rs is observed for a pattern density of 33% where copper lines having a width of 0.12 microns are separated by a dielectric layer that has a width of 0.24 microns as shown in Table 2.

TABLE 2

Rs mean and 3σ values
in m-ohms for a test structure where d8 = 0.12 μm, w2 = 0.24 μm

| Method | Cu Rs WIW 3σ | Cu Rs WTW 3σ | Sum (3σ) | Rs 3σ improvement | Rs mean |
|---|---|---|---|---|---|
| OLP | 7.2 | 8.2 | 10.8 | — | 69.5 |
| CLP | 6.3 | 3.9 | 7.3 | 32% | 69.8 |

A 22% improvement in 3σ variation for copper Rs is observed for a pattern density of 20% where copper lines having a width 0.12 microns are separated by a dielectric layer that has a width of 0.48 microns as shown in Table 3.

TABLE 3

Rs mean and 3σ values
in m-ohms for a test structure where d8 = 0.12 μm, w2 = 0.48 μm

| Method | Cu Rs WIW 3σ | Cu Rs WTW 3σ | Sum (3σ) | Rs 3σ improvement | Rs mean |
|---|---|---|---|---|---|
| OLP | 7.9 | 7.3 | 10.5 | — | 67.4 |
| CLP | 7.0 | 4.6 | 8.2 | 22% | 67.8 |

A 29% improvement in 3σ variation for copper Rs is observed for a pattern density of 13% where copper lines having a width 0.12 microns are separated by a dielectric layer that has a width of 0.84 microns as shown in Table 4.

TABLE 4

Rs mean and 3σ values
in m-ohms for a test structure where d8 = 0.12 μm, w2 = 0.84 μm

| Method | Cu Rs WIW 3σ | Cu Rs WTW 3σ | Sum (3σ) | Rs 3σ improvement | Rs mean |
|---|---|---|---|---|---|
| OLP | 6.8 | 6.7 | 9.4 | — | 64.2 |
| CLP | 6.1 | 2.7 | 6.6 | 29% | 64.5 |

A 12% improvement in 3σ variation for copper Rs is observed for a pattern density of 82% where copper lines having a width 12 microns are separated by a dielectric layer that has a width of 2.5 microns as shown in Table 5.

TABLE 5

Rs mean and 3σ values
in m-ohms for a test structure where d8 = 12 μm, w2 = 2.5 μm

| Method | Cu Rs WIW 3σ | Cu Rs WTW 3σ | Sum (3σ) | Rs 3σ improvement | Rs mean |
|---|---|---|---|---|---|
| OLP | 15.7 | 9.2 | 17.9 | — | 89.3 |
| CLP | 15.3 | 4.6 | 15.8 | 12% | 89.3 |

The test structures with a pattern density of 13–33% have a lower Rs mean than test structures with a pattern density of 50% or greater. This offset is due to an iso-dense CD bias of 35 nm during the photoresist patterning step. Isolated or semi-isolated trenches are typically printed smaller than densely formed trenches and the CD difference is carried through the entire sequence including etching and trench filling with the diffusion barrier layer and copper layer. It is understood that the FF model may not be able to compensate for large within wafer nonuniformity such as iso-nested CD bias resulting from previous process steps. As can be seen in Tables 1–5, the wafer based APC method of the present invention has a more pronounced effect on improving WTW 3σ than on WIW 3σ variation. However, WTW and WIW 3σ variation is reduced for all pattern densities in the present invention compared to a conventional approach in which an APC method is based only on a FB model.

The invention is also an advanced process control (APC) system for one or more polish processes comprised of a computer with a program that includes a feed forward model and a feed backward model, an APC controller, and a tool control system (TCS) for a polish tool. Preferably, the polish tool is a CMP tool and the polish process is an oxide (Cu, or TaN) polish of a copper layer that is formed on a TaN diffusion barrier layer in an opening within a dielectric layer on a wafer. The computer operates in a feed forward function by taking metrology data from previous process steps and determining an oxide (Cu, or TaN) polish time to achieve a copper thickness target based in part on a Rs target value that is inputted through a user interface and by using equations (1) through (5) as described previously. This information is transferred to the APC controller which adjusts the CMP recipe for the wafer accordingly and sends the updated oxide (Cu, or TaN) polish recipe to the TCS for the CMP tool. The APC controller communicates with the TCS through a tool application program (TAP). Post CMP data from the CMP tool or from an independent metrology tool is fed back to the FB model which is used by the computer to calculate an adjustment in oxide (Cu, or TaN) polish time for a subsequent wafer. Therefore, a real time adjustment in polish time and CMP recipe for each wafer in a plurality of wafers to be processed may be performed by a continual cycle of feed forward and feed backward communications. In one embodiment, the computer may function as a server and control up to 20 CMP tools simultaneously.

While this invention has been particularly shown and described with reference to, the preferred embodiments thereof, it will be understood by those skilled in the art that various changes in form and details may be made without departing from the spirit and scope of this invention.

We claim:

1. An advanced process control (APC) method for a target layer polish process in a polish tool that minimizes within wafer and wafer to wafer sheet resistance (Rs) variations in a plurality of wafers having a metal layer formed on a barrier layer within an opening in a dielectric layer, said metal layer has a thickness, width, and cross-sectional area, comprising:
   providing a plurality of wafers each having a metal layer that has been formed on a barrier layer within an opening in a dielectric layer by a sequence of processing steps;
   determining a relationship between the cross-sectional area of said metal layer and Rs;
   determining a total Rs ($Rs_{TOTAL}$) for the metal layer on each of said plurality of wafers before said target layer polish process;
   determining a target layer polish thickness target for said metal layer on each of said plurality of wafers; and
   calculating a target layer polish time for each of said plurality of wafers in the target layer polish process.

2. The method of claim 1 wherein said metal layer is comprised of copper and the baffler layer is comprised of TaN and said target layer polish process is performed in a CMP tool that polishes one or more of said copper layer, TaN baffler layer, and dielectric layer simultaneously.

3. The method of claim 1 wherein the relationship between the cross-sectional area of said metal layer and Rs is determined by plotting 1/cross-sectional area vs. Rs results for a plurality of wafers and line fitting the data.

4. The method of claim 1 wherein the total Rs is determined from the equation:

$$Rs_{TOTAL} = Rs_{PHOTO} + Rs_{CVD} + Rs_{ECP} + Rs_{ETCHING}$$

where $Rs_{PHOTO}$, $Rs_{CVD}$, $Rs_{ECP}$, and $Rs_{ETCHING}$ are terms that represent contributions from a patterning (photo) step, a CVD step, a metal deposition (ECP) step, and an etching step, respectively, to a variation in the width and thickness of said metal layer.

5. The method of claim 1 wherein said target layer polish thickness target for said metal layer is determined from the relationship between the cross-sectional area of said metal layer and Rs, the $Rs_{TOTAL}$, and the desired Rs value (Rs target value) for said metal layer in each of the plurality of wafers.

6. The method of claim 1 wherein the target layer polish time is determined by using the equation:

$$PT_t = Rs_T Rs_{TOTAL}/\alpha$$

where $PT_t$ is the polish time for a particular wafer, $Rs_T$ is the Rs target value provided for said metal layer, $\alpha$ is the polish rate in said target layer polish process, and $Rs_{TOTAL}$ is the value from the second determining step.

7. The method of claim 6 further comprised of modifying the target layer polish time based on a post target layer polish measurement data by including a disturbance factor ($d_K$) wherein the modified equation is the following:

$$PT_t = Rs_T - Rs_{TOTAL}/\alpha + d_K$$

where $d_K = (1-\lambda)d_{K-1} + \lambda(Rs_T - Rs_{n,\ TOTAL} - \alpha PT_{K-1})$ in which $d_{K-1}$ and $PT_{K-1}$ indicate a disturbance factor and the target layer polish time, respectively, for the (n−1)th wafer in the plurality of wafers, $Rs_{n,\ TOTAL}$ is $Rs_{TOTAL}$ for the nth wafer in a plurality of wafers, and $\lambda$ is a numerical value between 0 and 1.

8. The method of claim 7 wherein $d_{K-}$ is equal to 0 for the first wafer in the plurality of wafers to be polished in the target layer polish process.

9. The method of claim 7 wherein said a post target layer polish measurement data includes the polish rate of said metal layer in said target layer polish step on at least one wafer that has been processed in the process tool.

10. The method of claim 7 wherein any filter algorithm may be used to update said $d_{K-1}$.

11. The method of claim 1 wherein said first determining, second determining, third determining, and calculating steps are performed by a computer that is part of an advanced process control (APC) system which includes an APC controller that receives input from the computer and sends commands to one or more polish tools via a tool application program (TAP) and tool control system (TCS).

12. The method of claim 11 wherein the computer contains a feed forward (FF) model and a feed backward (FB) model wherein the FF model receives measurement data related to said sequence of processing steps and is used to perform the second determining, the third determining, and the calculating steps and wherein the FB model receives post target layer polish measurement data and is also used for the calculating step.

13. The method of claim 1, wherein the target layer is at least one of an oxide, a metal, and a barrier layer.

14. The method of claim 1, wherein the processing steps include at least one patterning step, CVD step, etch step, and metal deposition step.

15. An APC method for an oxide (Cu, or TaN) polish step in a CMP tool that minimizes within wafer and wafer to wafer sheet resistance (Rs) variations in a plurality of wafers having a copper layer, said copper layer has a thickness, width, and cross-sectional area and is formed on a TaN layer in an opening within a dielectric layer, comprising:

providing a plurality of wafers each having a copper layer that has been formed on a TaN layer in an opening within a dielectric layer by a sequence of processing steps;

determining a relationship between the cross-sectional area of said copper layer and Rs;

determining a total Rs for the copper layer on each of said plurality of wafers before said oxide (Cu, or TaN) polish process;

determining an oxide (Cu, or TaN) polish thickness target for said copper layer on each of said plurality of wafers; and calculating an oxide (Cu, or TaN) polish time for each of said plurality of wafers in the oxide (Cu, or TaN) polish process.

16. The method of claim 15 wherein said oxide (Cu, or TaN) polish process reduces the thickness of one or more of said copper layer, TaN layer, and dielectric layer.

17. The method of claim 15 wherein said opening is at least one of a trench and a trench formed above a via.

18. The method of claim 15 wherein the relationship between the cross-sectional area of said copper layer and Rs is determined by plotting 1/cross-sectional area vs. Rs results for a plurality of wafers and line fitting the data.

19. The method of claim 15 wherein the total Rs is determined from the equation:

$$Rs_{TOTAL} = Rs_{PHOTO} + Rs_{CVD} + Rs_{ECP} + Rs_{ETCHING}$$

where $Rs_{PHOTO}$, $Rs_{CVD}$, $Rs_{ECP}$, and $Rs_{ETCHING}$ are terms that represent contributions from a patterning (photo) step, a CVD step, a copper deposition (ECP) step, and an etching step, respectively, to a variation in the width and thickness of said copper layer.

20. The method of claim 15 wherein said oxide (Cu, or TaN) polish thickness target for said copper layer is determined from the relationship between the cross-sectional area of said metal layer and Rs, the $Rs_{TOTAL}$, and the desired Rs value (Rs target value) for said copper layer in each of the plurality of wafers.

21. The method of claim 15 wherein the oxide (Cu, or TaN) polish time is determined by using the equation:

$$PT_t = Rs_T - Rs_{TOTAL}/\alpha$$

where $PT_t$ is the polish time for a particular wafer, $Rs_T$ is the Rs target value provided for said copper layer, $\alpha$ is the polish rate in said oxide (Cu, or TaN) polish process, and $Rs_{TOTAL}$ is the value from the second determining step.

22. The method of claim 21 further comprised of modifying the polish time in the calculating step (e) based on post oxide (Cu, or TaN) polish measurement data by including a disturbance factor ($d_K$) wherein the modified equation is the following:

$$PT_t = Rs_T - Rs_{TOTAL}/\alpha + d_K$$

where $d_K = (1-\lambda)d_{K-1} + \lambda(Rs_T - Rs_{n,\,TOTAL} - \alpha PT_{K-1})$ in which $d_{K-1}$ and $PT_{K-1}$ indicate a disturbance factor and oxide (Cu, or TaN) polish time, respectively, for the (n−1)th wafer in the plurality of wafer, $Rs_{n,\,TOTAL}$ is $Rs_{TOTAL}$ for the nth wafer in a said plurality of wafers, and $\lambda$ is a numerical value between 0 and 1.

23. The method of claim 22 wherein $d_{K-1}$ is equal to 0 for the first wafer in the plurality of wafers to be polished in the oxide (Cu, or TaN) polish process.

24. The method of claim 22 wherein said post oxide (Cu, or TaN) polish measurement data include the polish rate of said copper layer in said oxide (Cu, or TaN) polish step on at least one wafer that has been processed in the process tool.

25. The method of claim 22 wherein any filter algorithm may be used to update said $d_{K-1}$.

26. The method of claim 15 wherein said first determining, second determining, third determining and calculating steps are performed by a computer that is part of an advanced process control (APC) system which includes an APC controller that receives input from the computer and sends commands to one or more polish tools via a tool application program (TAP) and tool control system (TCS).

27. The method of claim 26 wherein the computer contains a feed forward (FF) model and a feed backward (FB) model wherein the FF model receives measurement data related to said sequence of processing steps and is used to perform the second determining, the third determining, and the calculating steps and wherein the FB model receives post oxide (Cu, or TaN) polish measurement data and is also used for the calculating step.

28. The method of claim 26 wherein said APC controller is linked to more than one CMP process tool and to more than one computer that provides data input.

29. The method of claim 15, wherein said processing steps include at least one patterning step, CVD step, etch step, and copper deposition step.

* * * * *